United States Patent [19]

Sugahara et al.

[11] Patent Number: 4,870,031
[45] Date of Patent: Sep. 26, 1989

[54] METHOD OF MANUFACTURING A SEMICONDUCTOR DEVICE

[75] Inventors: Kazuyuki Sugahara; Tadashi Nishimura; Shigeru Kusunoki; Yasuo Inoue, all of Hyogo, Japan

[73] Assignee: Kozo Iizuka, Director General, Agency of Industrial Science and Technology, Tokyo, Japan

[21] Appl. No.: 102,655

[22] Filed: Sep. 30, 1987

Related U.S. Application Data

[63] Continuation-in-part of Ser. No. 837,063, Mar. 6, 1986, abandoned.

[51] Int. Cl.$^4$ .......................................... H01L 21/263
[52] U.S. Cl. ...................................... 437/82; 437/83; 437/173; 437/942; 437/973; 148/DIG. 90; 156/610; 156/620.72
[58] Field of Search ............... 156/620, 657, 662, 643, 156/610, 620.72; 219/121 LE, 121 LF, 121 LG, 121 EF, 121 EG; 437/973, 943, 82, 83, 942, 173; 148/D90

[56] References Cited

U.S. PATENT DOCUMENTS

| | | | |
|---|---|---|---|
| 3,600,237 | 8/1971 | Davis et al. | |
| 4,330,363 | 5/1982 | Biegesen et al. | 156/620 |
| 4,444,620 | 4/1984 | Kovacs et al. | 156/657 |
| 4,523,962 | 6/1985 | Nishimura | 148/1.5 |
| 4,599,133 | 7/1986 | Miyao et al. | 156/620.72 |
| 4,661,167 | 4/1987 | Kusunoki et al. | 156/620.72 |
| 4,670,086 | 6/1987 | Learny | 156/620.72 |

FOREIGN PATENT DOCUMENTS 0121829  7/1984  Japan ............................ 156/620.72

OTHER PUBLICATIONS

Possin et al "The Effects of Selectively . . . on Amorphous Substrates" Mat. Res. Soc. Symp. Proc., vol. 13 (1983) Elsevier Science Pub Co.
Zehner et al., "Surface Studies of Lasar Annealed Semi--Conductors" Mat. Res. Soc. Symp. Proc., vol. 13(1983) Elsevier Sci. Pub. Co.
R. Mukai et al. "Single Crystalline Si Islands on an Amorphous, Insulating Layer Recrystallized by an Indirect . . . Circuits" May 15, 1984, pp. 994–996.
Coliage et al, "The Use of Selective Annealing for Growing Very Large Grains in Silicon on Insulating Films" Japanese Journal of Applied Physics, vol. 22, pp. 205–208 (1983).

Primary Examiner—David L. Lacey
Assistant Examiner—L. Johnson
Attorney, Agent, or Firm—Bernard, Rothwell & Brown

[57] ABSTRACT

In a method of manufacturing a semiconductor device comprising melting an amorphous or polycrystalline first semiconductor layer formed on the surface of a first dielectric layer by irradiating energy rays thereon, and converting the same into single crystals by the subsequent lowering of the temperature and forming a second dielectric layer and a second semiconductor layer on the first semiconductor layer. Energy rays are irradiated under the condition capable of melting the first semiconductor layer through the second semiconductor layer and the second dielectric layer and, after the completion of the conversion into single crystals, the second semiconductor layer and the second dielectric layer are eliminated through etching.

16 Claims, 3 Drawing Sheets

METHOD OF MANUFACTURING A SEMICONDUCTOR DEVICE

CROSS REFERENCE TO RELATED APPLICATION

This is a continuation in part of copending U.S. application Ser. No. 837,063, filed Mar. 6, 1986 now abandoned.

BACKGROUND OF THE INVENTION

1. Field of the Invention

This invention relates to an improved method of manufacturing semiconductor devices and, more specifically, it relates to a method of forming a single crystal film of a semiconductor on a substrate such as a dielectric material and then forming one or more devices, such as transistors, on the film.

2. Description of the Prior Art

For increasing the operational speed and packing density of semiconductor devices, attempts have been made to manufacture a semiconductor integrated circuit with a low stray capacitance by isolating circuit devices with dielectric material, and attempts have been made as well to laminate the circuit devices vertically and horizontally, that is, to manufacture a so-called three-dimensional integrated circuit. One well known method includes forming a semiconductor layer on a dielectric material and then forming circuit devices in the semiconductor crystalline layer. Such a semiconductor crystalline layer can be formed by depositing a non-single crystal semiconductor layer, such as a polycrystalline or amorphous semiconductor layer, on a substrate such as a dielectric material and irradiating the semiconductor layer with energy rays or beams such as laser beams or electron beams to heat the surface layer to cause recrystallization.

Referring to FIGS. 2a and 2b, there is shown a composite body of a semiconductor crystalline layer formed on a dielectric substrate in accordance with the conventional method as set forth above. In FIGS. 2a and 2b, there is shown a single crystal silicon substrate 11, a silicon oxide film 12, a polycrystalline silicon film 13 and a silicon nitride film 14 deposited on the polycrystalline film 13 and patterned as parallel stripes each of about 5 $\mu$m in width and spaced apart at about 10 $\mu$m intervals. The silicon oxide film 12 is formed by a thermal oxidation process, and the polycrystalline silicon film 13 and the silicon nitride film 14 are formed by a chemical vapor deposition process (hereinafter simply referred to as a "CVD" process). The polycrystalline silicon film 13 can be melted and recrystallized, for example, by irradiating the film with argon laser beams of about 100 $\mu$m diameter scanning in parallel with the stripes of the silicon nitride film 14 at a rate of about 25 cm/sec. In this case, since the silicon nitride film 14 serves as an antireflection layer for the argon laser beam, the beam is more fully absorbed and the temperature of the polycrystalline silicon film 13 under such silicon nitride film portions 14 is therefore higher than that of the polycrystalline silicon film 13 in the regions where the silicon nitride film 14 is absent and where less energy is therefore absorbed by the film. The solidification and recrystallization of the polycrystalline film 13 begins and propagates continuously from the lower temperature regions with no silicon nitride film 14 toward the higher temperature regions of the polycrystalline silicon film 13 under the stripes of the silicon nitride film 14 to form single crystal structures.

Since in the conventional method just described, the radiation from the energy beam impinges directly on the semiconductor layer in which devices such as transistors are to be formed subsequently, power fluctuations, and other variations in the energy beam, even with relatively constant power, result in grain boundaries, unevenness and other defects in the single crystal structure so formed.

SUMMARY OF THE INVENTION

One object of this invention is to provide a method of manufacturing semiconductor devices including forming a semiconductor layer of single crystal structure on a substrate over a large area.

In accordance with one embodiment of this invention, a first semiconductor layer of non-single crystal semiconductor material, such as an amorphous or polycrystalline semiconductor, is formed on a substrate such as a dielectric layer. A separator layer, which may be a dielectric layer is then formed on the first semiconductor layer, and a second semiconductor layer is formed on the separator layer. Radiation energy from an energy beam is then applied to the second semiconductor layer in the form of the desired parallel stripe pattern with parallel stripes of higher temperature being interspersed with substantially parallel striped portions of lower temperature material. The energy beam may be, for example, a laser beam or an electron beam. The temperature pattern so formed in the second semiconductor layer is above the melting point of the first semiconductor layer and heat flows from the second semiconductor layer through the separator layer into the first semiconductor layer to melt the first semiconductor layer and at the same time form therein the striped parallel pattern of higher and lower temperature regions in the first semiconductor layer.

The second semiconductor layer acts as a buffer or filter to absorb, filter and attenuate power fluctuations and other variations in the parameters of the irradiating beam so that the temperature pattern developed in the first semiconductor layer is substantially shielded from such fluctuations and variations and therefore when cooled and recrystallized is substantially free from grain boundaries and other defects.

The parallel stripe temperature pattern may be created in the second semiconductor layer by forming thereon a mask pattern in the desired parallel stripe pattern in which the mask portions either reflect a substantial portion of the beam energy or which through anti-reflection effect cause substantial increase in the absorption of the beam energy. Where a reflective pattern is used, the portions of the second semiconductor layer below the reflective portions of the mask pattern are lower in temperature than the remaining portions and where the absorptive pattern is used the portions of the second semiconductor layer below the pattern portions are higher in temperature.

The striped mask pattern may also be formed on a second separator layer, such as a dielectric layer, formed on the second semiconductor layer.

The striped pattern may also be formed by any other suitable means as long as the second semiconductor layer is utilized as a buffer layer to transfer the temperature pattern to the first semiconductor layer through the filtering and smoothing process to avoid direct exposure of the first semiconductor layer to flicker, fluctuations and other variations in the parameters of the energy beam.

After the first semiconductor layer is melted with the aforementioned striped temperature pattern formed therein, it is allowed to cool and recrystallize. Recrystallization and single crystal growth begins in the lower temperature stripe regions and proceeds and propagates laterally into the higher temperature stripe regions to form single crystal structures. After the structure is cooled, the mask pattern and the second semiconductor layer and separator layer are removed leaving only the recrystallized first semiconductor layer. Suitable semiconductor devices, such as transistors, may then be formed in the single crystal structure of the first semiconductor layer utilizing various semiconductor processing techniques.

BRIEF DESCRIPTION OF THE DRAWINGS

FIG. 1a is a plan view of a portion of a semiconductor plate to be processed by an energy beam irradiation step in a method of manufacturing a semiconductor device according to one embodiment of this invention and FIG. 1b is a cross-sectional view of the semiconductor plate of FIG. 1a;

FIG. 2a is a plan view of a portion of a semiconductor plate prepared for processing by the energy beam irradiation step and the conventional prior art method and FIG. 2b is a cross sectional view of the semiconductor plate of FIG. 2a;

DESCRIPTIION OF THE PREFERRED EMBODIMENTS

Figure 1A:
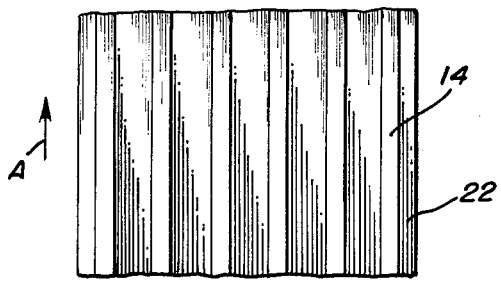
Figure 1B:
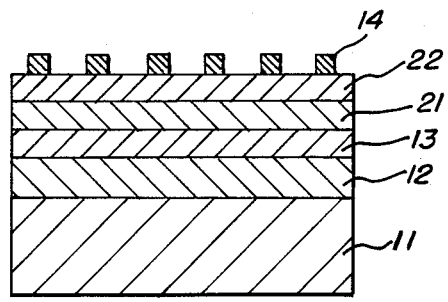
Figure 2A:
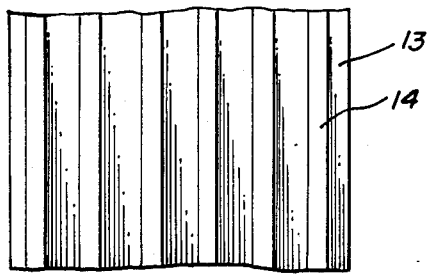
Figure 2B:
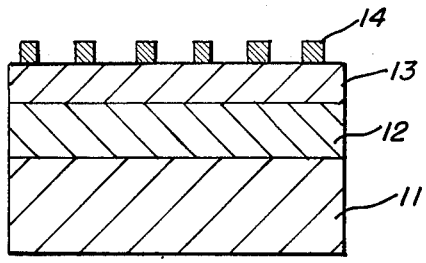

Referring now to FIGS. 1a and 1b, there is shown a semiconductor plate prepared for processing by an energy beam exposing step forming part of the method of manufacturing a semiconductor device according to one embodiment of this invention. The semiconductor plate comprises a semiconductor substrate 11, a first dielectric separator layer 12, a first semiconductor layer 13, a second dielectric separator layer 21, a second semiconductor layer 22 and a patterned mask layer 14 laminated in the foregoing order on a surface of the substrate 11.

The semiconductor substrate 11 may be a silicon wafer having any desired thickness and surface area, which may be fabricated by a method known in the art so as to provide a desired semiconductor device structure. While it is preferred for the purposes of certain embodiments herein described that the substrate 11 be of single crystal semiconductor material, it should be understood that for various applications of this invention, the substrate 11 may be formed of any suitable supporting material and need not be a semiconductor material as such.

In the case where the substrate 11 is made of single crystal silicon, the first dielectric layer positioned thereon preferably consists of silicon dioxide and may be readily formed by a well-known thermal oxidation process.

The first semiconductor layer 13 which is formed on the dielectric separator layer 12 may be made of a deposited non-single-crystal semiconductor material such as amorphous, microcrystalline or polycrystalline silicon. The non-single-crystal semiconductor layer 13 may be formed on the first separator layer 12 by a CVD process.

In one embodiment of this invention, the second separator layer 21 may be made of a dielectric material such as silicon oxide formed on the first semiconductor layer 13. The second separator layer 21 may, for example, be formed on the first semiconductor layer 13 by a thermal oxidation process. The second semiconductor layer 22 is formed on the second separator layer 21 and may be of the same material and formed in the same manner as the first semiconductor layer 13. That is, the second semiconductor layer 22 may be amorphous, microcrystalline or polycrystalline silicon formed by a CVD process. For reasons to be explained later, the melting temperature of the second semiconductor layer 22 should be at least equal to or greater than the melting temperature of the first semiconductor layer 13.

Reference numeral 14 denotes a mask in the form of a patterned layer disposed on the surface of the second semiconductor layer 22. The mask layer 14 may be comprised of one or more materials or layers of materials having selected reflection characteristics. The composition and structure of the mask layer 14 may be chosen so that the exterior surface thereof is highly reflective to an impinging energy beam, in which case it is referred to as a reflective layer, or it may be chosen so as to have low reflectance and high absorption of the incident beam, in which case it is referred to as an absorptive layer.

Where the energy beam is an electron beam, the patterned mask layer 14 may be in the form of a composite reflective layer of high temperature melting point metal such as tungsten with a thickness of from about 0.05 to about 1 $\mu$m and a silicon nitride film with a thickness of about 0.01 to about 0.03 $\mu$m. If the energy beam is a laser beam, the patterned mask layer 14 may be in the form of an absorptive layer of silicon nitride with a thickness of about 0.05 $\mu$m with the parallel stripes each being about 5 $\mu$m wide and spaced apart frm each other at intervals of about 10 $\mu$m.

Preferred thicknesses for the layers 21 and 22 are dependent on various factors including their compositions, the methods of forming them and the characteristics desired for the semiconductor device products to be formed. As an example, if the second dielectric separator layer is made of silicon oxide, a preferred thickness range thereof is from about 0.05 to about 0.8 $\mu$m, and if the second semiconductor layer 22 is made of polycrystalline silicon, a preferred thickness range thereof is from about 0.2 to about 1 $\mu$m. More preferably, the second dielectric separator layer 21 consists of a composite body comprising a silicon nitride film and a silicon oxide film, in which the silicon nitride film is preferably disposed adjacent to and in contact with the second semiconductor layer 22.

The thicknesses of the silicon oxide and silicon nitride films in the composite body of layer 21 are chosen to form a reflection layer to reflect away from the first semiconductor layer 13 any portions of the incident laser beam which may penetrate the second semiconductor layer 22. This avoids any significant direct heating of the first semiconductor layer 13 by the laser beam.

The semiconductor plate formed of the above described structure is exposed to an energy beam such as an electron beam or a laser beam. In the case where the energy beam is a laser beam, the mask layer is preferably an absorptive layer.

Suitable laser beams are obtainable from a continuously oscillating argon laser source in which the diameter of the beams is restricted to a smaller value, for example about 100 $\mu$m. When the laser beams are directed onto the surface of the semiconductor plate having the patterned mask layer 14 and scanned in the longitudinal direction along the stripes of layer 14, that is along the direction of the arrow A in FIG. 1a at an appropriate speed, for example about 25 cm/sec, the temperature of the layer 14 rises and the temperature of the second semiconductor layer 22 is increased at those portions adjacent to and beneath the layer stripe portions 14 to a greater degree than the temperature of those portions of the second semiconductor layer 22 between the layer stripe portions 14. That is, the striped pattern of mask layer 14 imprints the temperature distribution in the second semiconductor layer 22 in which laterally extending substantially parallel higher temperature stripe portions are interspersed alternately with laterally extending substantially parallel lower temperature stripe portions. This same temperature pattern is in turn transferred through heat transfered by through the separator layer 21 to the first semiconductor layer 13. After passage of the laser beam, crystallization in the melted first semiconductor layer 13 starts in the lower temperature stripe portions in between the stripes of the mask layer 14 and then successively propagates to the higher temperature stripe regions as the layer 13 cools so that the layer 13, which originally was amorphous, microcrystalline or polycrystalline, is converted into large area single crystals.

Since the fluctuations in the laser beam, such as variations in the intensity of the beam, are absorbed in the thermal mass of the second semiconductor layer 22, such variations are filtered out and do not reach the first semiconductor layer 13. Such variations therefore have no significant effect on the temperature distribution in the first semiconductor layer 13. In other words, the fluctuations in the impinging laser beam are averaged out due to the high heat conductivity of the second semiconductor layer 22 which is made of amorphous, microcrystalline or polycrystalline material. Further, since the first semiconductor layer 13 is sandwiched between the first and second dielectric separator layers 12 and 21, a preferred flatness can be maintained after the process of melting and solidification.

In the case where an electron beam is used as the source of energy rays, the patterned mask layer 14 is made of a material having satisfactory reflectivity to the electron beam. In such case, the temperature distribution within the second semiconductor layer 22 upon irradiation by the electron beam exhibits a pattern in which the lower temperature regions are those underlying the stripes of the mask layer 14 and the higher temperature regions are those in between the stripes of the mask layer 14. Accordingly, as contrasted to the case where a laser beam is used, melting of the first semiconductor layer 13 begins in the portions in between the stripes of the mask layer 14 and recrystallization begins in the portions underlying the stripes of the mask layer 14. The flux of the electron beam may have an intensity distribution such that the intensity of the beam is lower at the center but the intensity of the beam is adjusted such that all portions of the first semiconductor layer 13 are sequentially melted as the beam is swept over and parallel in direction to the stripes in the mask pattern 14.

Subsequent to energy beam irradiation and recrystallization, the patterned mask layer 14, the second semiconductor layer 22 and the second dielectric separator layer 21 are removed by etching to expose the semiconductor layer 13 of single crystals. Since the striped pattern of alternating higher and lower temperature stripe portions is the same whether a laser or an electron beam is used, except only that in one the higher temperature portions underly the mask portions and in the other are in between the mask portions, the single crystal structures grow in exactly the same manner and are thus the same for either type of beam. In either case the second semiconductor layer 22 acts as a buffer or filter to attenuate, absorb and average out variations or fluctuations in the beams and to avoid defects in the single crystal structures that would otherwise be caused by such variations or fluctuations.

Thus, as the energy beam is swept over the semiconductor plate in a direction parallel to the mask layer 14, the second semiconductor layer 22 is heated to a temperature at or above the melting point of the first semiconductor layer while forming in the second semiconductor layer the laterally extending substantially parallel higher and lower temperature stripe portions in the pattern of the mask layer 14. Heat absorbed in the second semiconductor layer flows into the first semiconductor layer to melt the first semiconductor layer and form therein the same laterally extending substantially parallel higher and lower temperature stripe portions in the same pattern of the mask layer 14. Upon cooling of the first semiconductor, nucleation and single crystal growth begins in the lower temperature portions of the first semiconductor layer and propagates laterally toward and into the higher temperature stripe portions to form single crystal structures in the first semiconductor layer. Because of the shielding effect of the second semiconductor layer 22, such single crystal structures are substantially free of defects such as grain boundaries. High quality semiconductor devices, such as transistors, are then formed in the single crystal structures using well known techniques for the manufacture of such devices.

Figure 3:
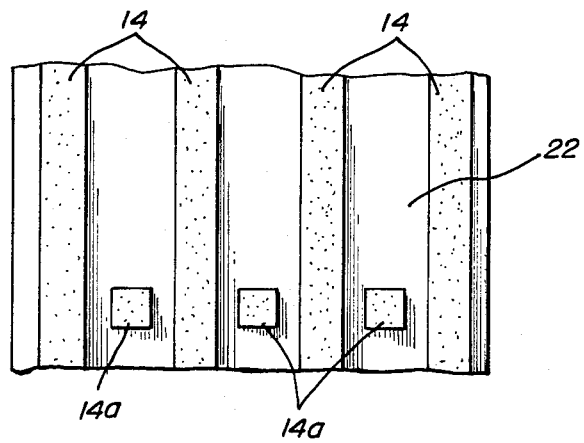
FIGS. 3 and 4 are respectively plan and cross sectional views of another semiconductor plate arranged for processing in accordance with another embodiment of this invention.
Figure 4:
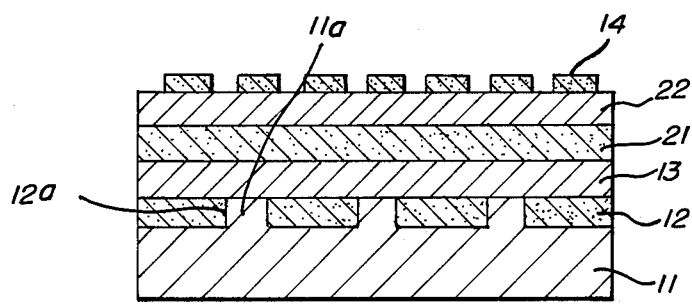

Referring now the FIGS. 3 and 4, there is shown another embodiment of the present invention in which the first separator layer 12 is formed with apertures 12a therein, which are generally of square or rectangular cross section but may be of any shape, through which connecting portions 11a of the semiconductor substrate protrude. These connecting portions 11a of the semiconductor substrate are in direct contact with the first semiconductor layer 13 at portions in between the stripes 14 where, in the case illustrated, single crystal growth begins and thus act to align the crystal axis of recrystallized portions of the first semiconductor 13 with that of the single crystal substrate.

Because of the heat sinking from the first semiconductor layer 13 to the connecting portions 11a, additional patterned areas 14a are placed over these connecting portions to increase heat absorption in these areas to make up for the heat lost through heat sinking action to the connecting portions 11a and maintain the temperature in these regions of the first semiconductor 13 at the same level as those adjoining regions between the stripes of the mask layer 14.

Figure 5:
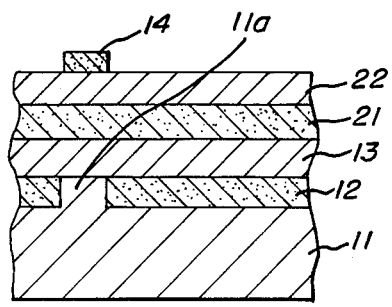
FIG. 5 is a cross-sectional view of another semiconductor plate arranged for processing in accordance with another embodiment of this invention.

FIG. 5 is a cross sectional view of another embodiment in which the connecting portion 11a is in the from of a stripe positioned beneath one of the stripes of the patterned layer 14.

Figure 6:
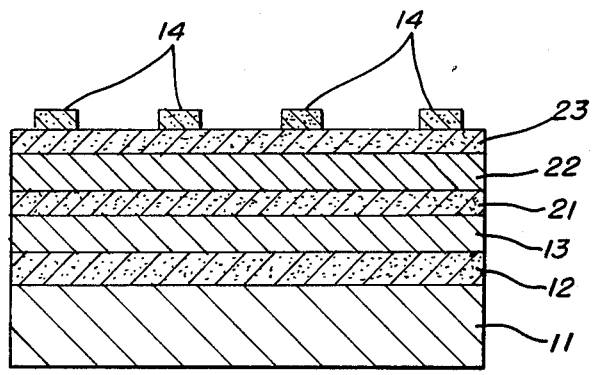
FIG. 6 is a cross-sectional view of a semiconductor plate arranged for processing in accordance with still another embodiment of this invention.

FIG. 6 shows another embodiment in which a third separator layer 23, which may also be formed of a dielectric material, is placed on top of the second semiconductor layer 22 with the mask layer 14 then being positioned on the third dielectric separator layer 23. The third dielectric separator layer 23 may, for example be formed of silicon dioxide having a thickness of about 835A. The mask layer 14 may then be formed of silicon nitride so as to cooperate with the silicon dioxide layer to provide absorption or reflection of the impinging laser beam.

Figure 7:
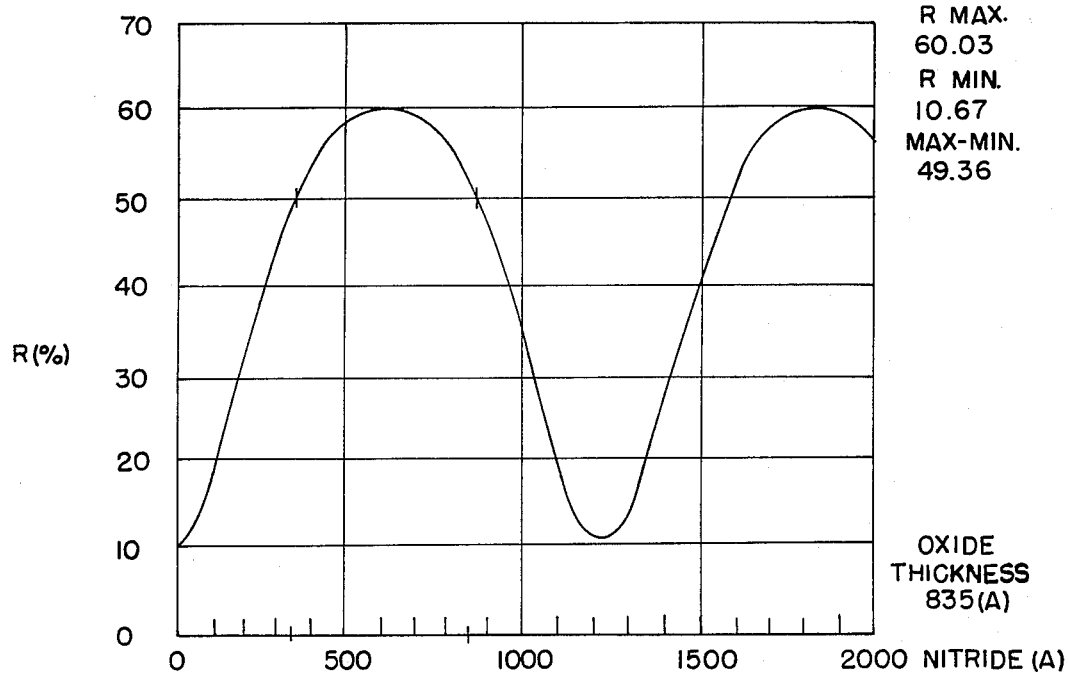
FIG. 7 is a graphical representation of the relationship between the reflectance to a laser beam of selected wavelength of a silicon nitride coating on a substrate of silicon dioxide of selected thickness as a function of the thickness of the silicon nitride coating.

FIG. 7 shows the reflectance R in percent as a function of the thickness of the silicon nitride layer 14 on a silicon dioxide layer having a thickness of 835 A. The first maximum reflectance point is a reflectance of about 60% for a silicon nitride ($Si_3N_4$) layer of about 600 A in thickness for a laser beam wavelength of about 4880 A. It is noted that at least 50% reflectance is achieved over a preferred range of silicon nitride layer thickness of from about 350 A to about 800 A. The reflectance of the silicon oxide layer alone is about 39%. Minimum reflectance of the laser beam is about 10% at a thickness of silicon nitride of just over 1200 A. A difference in the reflectance of the stripe portions of mask layer 14 and the surfaces in between the stripe portions of 20% or more has been found to give good results.

Figure 8:
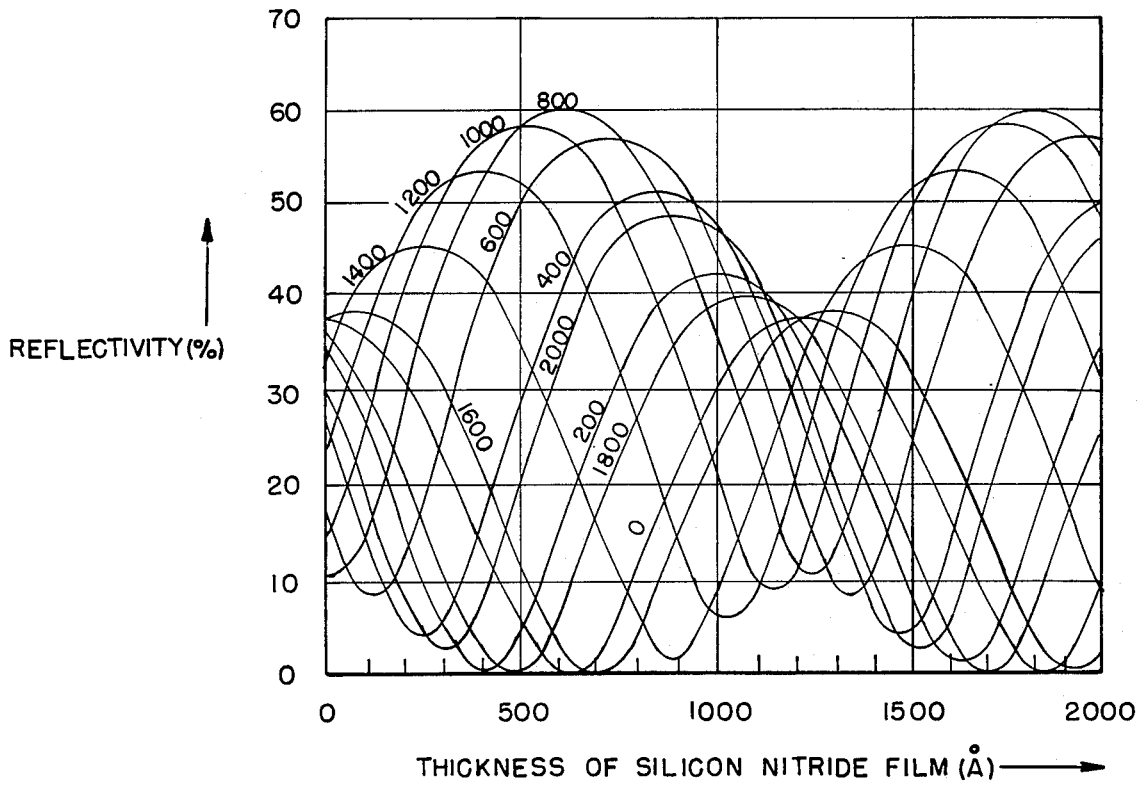
FIG. 8 is a graphical representation of reflectance to a laser beam similar to that shown in FIG. 7 except that the reflectance characteristics are shown for a number of different thicknesses of the silicon dioxide substrate.

FIG. 8 shows reflectance of a laser beam of 4880 A wavelength as a function of thickness of the silicon nitride film for various thicknesses of the silicon dioxide substrate. The thicknesses of the silicon dioxide substrate is given by the numerals adjacent each of the curves in FIG. 8.

In all the embodiments set forth, the second semiconductor layer 22 may be formed of the same material as the first semiconductor layer 13 or of another semiconductor material having a higher melting point than that of the first semiconductor material.

The formation of the single crystal structures of the first semiconductor layer 13 and the manufacture of semiconductor devices therein and thereon may be performed on a single crystal substrate 11 on which semiconductor devices have already been formed so that three dimensional semiconductor circuits may thus be manufactured in integrated form.

What is claimed is:

1. A method of manufacturing a semiconductor device on a substrate comprising the steps of:
   (a) depositing on a substrate a first semiconductor layer formed of non-single crystal semiconductor material;
   (b) forming on said first semiconductor layer a separator layer;
   (c) depositing on said separator layer a second semiconductor layer;
   (d) sequentially heating portions of said second semiconductor layer to a temperature above the melting point of said first semiconductor layer while simultaneously forming in said heated portions a laterally non-uniform temperature pattern in which laterally extending substantially parallel higher temperature stripe portions are interspersed alternately with laterally extending substantially parallel lower temperature stripe portions, and thereby melting the adjacent portions of said first semiconductor layer through heat transfer from said second semiconductor layer through said separator layer while forming in said adjacent melted portions of said first semiconductor layer the pattern of laterally extending substantially parallel higher and lower temperature stripe portions corresponding to said laterally non-uniform temperature pattern;
   (e) cooling the melted portions of said first semiconductor layer whereby nucleation and single crystal growth is caused to first begin therein in said lower temperature stripe portions and propagate laterally toward and into said higher temperature stripe portions to form a single crystal structure through re-crystallization;
   (f) removing said second semiconductor layer and said separator layer; and
   (g) forming at least one semiconductor device in said single crystal structure of said first semiconductor layer.

2. A method as set forth in claim 1 wherein said substantially parallel higher and lower temperature stripe portions are formed in said second semiconductor layer by:
   (a) positioning a mask layer over said second semiconductor layer, said mask layer being patterned in the form of substantially parallel stripe portions in the form of the desired parallel stripe temperature pattern and selected to influence the magnitude of absorption and reflection of an energy beam passing therethrough; and
   (b) irradiating said second semiconductor layer with an energy beam through said mask layer whereby energy absorption in selected parallel stripe portions of said second semiconductor layer is enhanced to form higher temperature stripe portions and is reduced by reflection of said energy beam in the interspersed stripe portions.

3. A method as set forth in claim 2 in which the energy beam is an electron beam.

4. A method as set forth in claim 2 in which the energy beam is a laser beam.

5. A method as set forth in claim 2 in which a second separator layer is formed on said second semiconductor layer and said mask layer is positioned on said second separator layer.

6. A method as set forth in claim 2 wherein said separator layer has openings therein through which connecting portions of said single crystal semiconductor extend to make contact with said first semiconductor layer.

7. A method as set forth in claim 6 in which said mask layer includes energy absorption enhancing portions positioned over said single crystal connecting portions for enhancing absorption of energy from said energy beam in those regions of said second semiconductor layer positioned over said single crystal connecting portions.

8. A method as set forth in claim 2 in which said separator layer comprises silicon oxide having a thickness of from about 0.05 to 0.8 μm, and said second semiconductor layer is formed of non-single crystal silicon having a thickness of from about 0.2 to 1 μm.

9. A method as set forth in claim 8 wherein said separator layer is formed of a composite body comprising a silicon nitride film and a silicon oxide film, in which said silicon nitride film is disposed on the side adjacent to said second semiconductor layer.

10. A method as set forth in claim 2 wherein the mask layer is formed of silicon nitride and the energy beam is a laser beam.

11. A method as set forth in claim 10 wherein the mask layer has a thickness of from about 0.035 to about 0.08 μm.

12. A method as set forth in claims 2, 10 or 11 wherein the energy beam is a laser beam and is moved at a predetermined speed along the longitudinal direction of said substantially parallel stripe portions of said mask layer.

13. A method as set forth in claim 2 wherein said mask layer is a composite body comprising a silicon nitride film and a high temperature melting point metal film, and the energy beam is an electron beam.

14. A method as set forth in claim 13 wherein the silicon nitride film has a thickness of from about 0.01 to about 0.03 μm and the high temperature melting point metal film has a thickness of from about 0.05 to about 1 μm.

15. A method as set forth in claim 14 wherein the high temperature melting point metal film is tungsten.

16. A method as defined in claims 13, 14 or 15 wherein the electron beam is moved at a predetermined speed along the longitudinal direction of said substantially parallel stripe portions of said mask layer.

* * * * *

UNITED STATES PATENT AND TRADEMARK OFFICE
CERTIFICATE OF CORRECTION

PATENT NO. : 4,870,031

DATED : September 26, 1989

INVENTOR(S) : KAZUYUKI SUGAHARA ET AL.

It is certified that error appears in the above-identified patent and that said Letters Patent is hereby corrected as shown below:

On the title page, between sections "[22]" and "[63]", insert the following:
--[30] Foreign Application Priority Data
Oct. 7, 1985 [JP] Japan.............60-221891--;

On the title page, section [56], line 11, "Learny" should be --Leamy--.

Title page, OTHER PUBLICATIONS, line 7, delete "-";
Title Page, OTHER PUBLICATIONS, line 13, "Insulating" should be --Insulator--.

Col. 4, line 54, "frm" should be --from--.

Signed and Sealed this

Fourth Day of September, 1990

Attest:

HARRY F. MANBECK, JR.

*Attesting Officer*     *Commissioner of Patents and Trademarks*